United States Patent
Lee et al.

(10) Patent No.: US 6,754,087 B1
(45) Date of Patent: Jun. 22, 2004

(54) POWER SUPPLY STRUCTURE FOR HIGH DENSITY SERVERS

(75) Inventors: Tzung-Han Lee, Hsin-Tien (TW); Edy Sung, Hsin-Tien (TW)

(73) Assignee: Shin Jiuh Corp., Taipei Hsien (TW)

( * ) Notice: Subject to any disclaimer, the term of this patent is extended or adjusted under 35 U.S.C. 154(b) by 12 days.

(21) Appl. No.: 10/352,939

(22) Filed: Jan. 29, 2003

(51) Int. Cl.⁷ ............................................... H05K 7/18
(52) U.S. Cl. .................... 361/796; 361/823; 361/825; 361/803
(58) Field of Search ................................ 361/796, 823, 361/803, 671, 716, 723, 801, 685, 682, 825, 683

(56) References Cited

U.S. PATENT DOCUMENTS 6,040,982 A * 3/2000 Gandre et al. .............. 361/724
6,461,172 B2 * 10/2002 Ross ........................... 439/78

* cited by examiner

*Primary Examiner*—David Martin
*Assistant Examiner*—Huang Bui
(74) *Attorney, Agent, or Firm*—Birch Stewart Kolasch & Birch, LLP

(57) ABSTRACT

A power supply structure for high density servers bridging a system end and a power supply end includes a power receiving unit located on the system end, a power transmission unit located on the power supply end, and a conductive connection element connecting the power receiving unit and the power transmission unit through fasteners. The conductive connection element establishes electric connection with the power receiving unit and the power transmission unit through the fasteners so that power supply provided by the power supply end is transmitted from the power transmission unit to the conductive connection element which in turn transmits the power to the system end through the power receiving unit. The power supply structure of the invention may be assembled and installed quickly.

7 Claims, 4 Drawing Sheets

POWER SUPPLY STRUCTURE FOR HIGH DENSITY SERVERS

FIELD OF THE INVENTION

The present invention relates to a power supply structure for high density servers and particularly to a power supply structure that has a simple structure to connect a power supply end to a system end through a power transmission unit, a power receiving unit and a conductive connection element.

BACKGROUND OF THE INVENTION

With increasing advances of technologies, data to be processed by computers also increase greatly. A single chip processor or central processing unit is no longer powerful enough to process the growing amount of data. Computer vendors have developed super computers that consist of a plurality of connecting processing units to meet these demands. The processing units include a main board, hard disk drives and cooling fan sets.

Refer to FIG. 1 for a conventional super computer. It has a host casing with a plurality of processing units located on a front side. The processing units are integrated and controlled through a main board. On the rear side of the host casing, there are a plurality of power supply devices which are integrated and distributed through a control panel. The main board and the control panel are connected by flat cables. There are also cooling fan sets located between the main board and the control panel to disperse heat generated in the host casing. Although the construction set forth above can greatly reduce the size and weight of the host casing, it still has the following drawbacks:

1. The main board and the control panel are connected by flat cables which often have extra portions that must be held in the space between the main board and the control panel. The space could become too crowd and the cooling fan sets are not able to disperse heat effectively from the interior of the host casing.
2. The flat cables are generally connected to the main board and the control panel by insertion. It is not a secured or reliable connection method. In addition, the cooling fans generate vibration during operation and may shake the flat cable loose. The extra portions of the flat cables often are entangled with one another. In the event of one flat cable requires to be removed for repairs or maintenance, it is easy to cause unfastening of other flat cables.
3. The space between the main board and the control panel is narrow. With the flat cables crowding and entangling in the small space, assembly and disassembly is very inconvenience.

SUMMARY OF THE INVENTION

Therefore the primary object of the invention is to resolve the aforesaid disadvantages. The invention provides a simplified power supply structure for high density servers that has a conductive connection element to connect a system end and a power supply end to achieve fast and reliable assembly and connection.

In order to achieve the foregoing object, the invention includes a system end connecting to a power receiving end, and a power supply end connecting to a power transmission end. A conductive connection element is fastened to the power transmission unit and the power receiving unit to directly transmit power supply to the power supply end thereby to form a power supply structure for high density servers.

The foregoing, as well as additional objects, features and advantages of the invention will be more readily apparent from the following detailed description, which proceeds with reference to the accompanying drawings.

DESCRIPTION OF THE PREFERRED EMBODIMENTS

Figure 1:
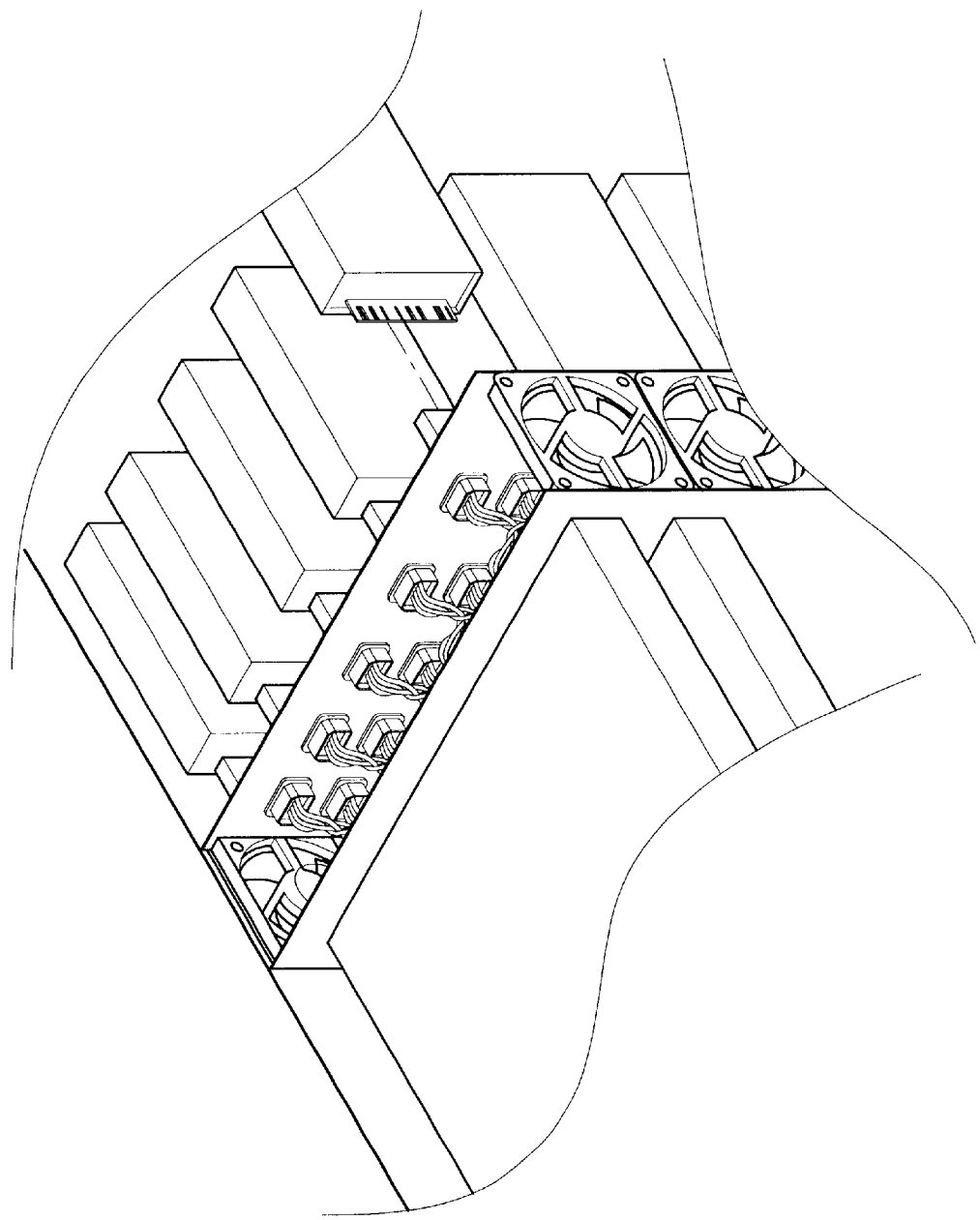
FIG. 1 is a perspective view of a conventional power supply structure.
Figure 2:
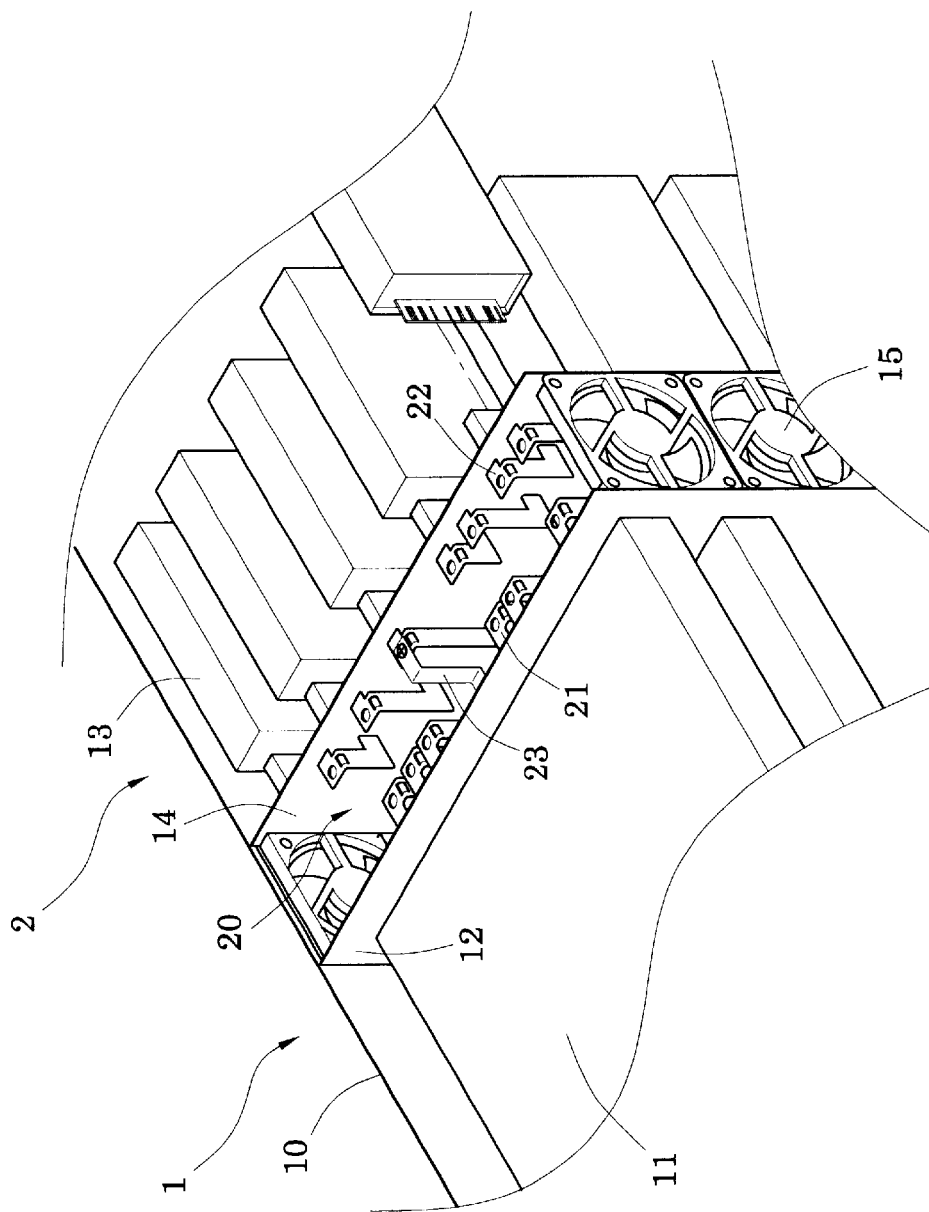
FIG. 2 is a perspective view of the invention.
Figure 3:
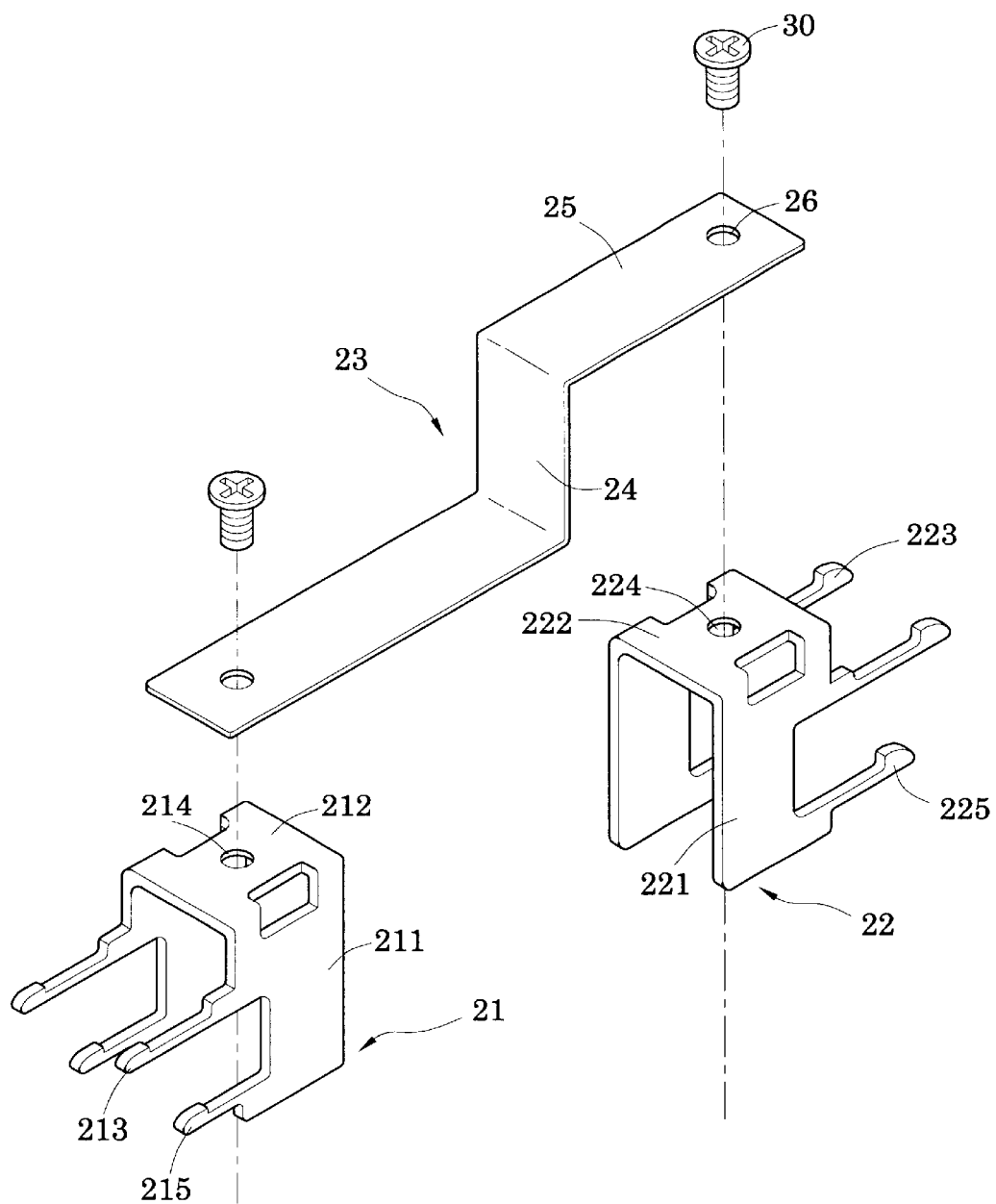
FIG. 3 is an exploded view of the invention.

Referring to FIGS. 2 and 3, the power supply structure for high density servers of the invention is located in a host casing 10 which has a system end 1 and a power supply end 2. The system end 1 connects to a plurality of processing units 11 which are integrated through a main board 12. The power supply end 2 includes power supply devices 13 which are integrated through a control panel 14. There are cooling fans 15 located on the lateral sides of the main board 12 and the control panel 14. The power supply structure 20 is connected between the system end 1 and the power supply end 2. The power supply structure 20 consists of a power receiving unit 21 located on the system end 1, a power transmission unit 22 located on the power supply end 2 and a conductive connection element 23 located on the power transmission unit 22 to connect the power receiving unit 21 and the power transmission unit 22 through fasteners 30. The conductive connection element 23 is generally a metal blade which has two ends forming respectively a fastening section 25 corresponding to the power receiving unit 21 and the power transmission unit 22. The fastening section 25 is bent to form an adjusting section 24 corresponding to the elevation difference of the power receiving unit 21 and the power transmission unit 22 so that the fastening section 25 may bridge the power receiving unit 21 and the power transmission unit 22 in a horizontal manner. The power receiving unit 21 and the power transmission unit 22 have respectively a loading section 212 and 222 corresponding to the conductive connection element 23. The loading sections 212 and 222 have respectively a connecting hole 214 and 224 corresponding to fastening holes 26 formed on the fastening section 25. The loading sections 212 and 222 further have respectively an extending section 211 and 221 for voltage distribution. The extending sections 211 and 221 have respectively a connecting section 215 and 225 for connecting to the main board 12 and the control panel 14. The loading section 212 of the power receiving unit 21 also has a coupling section 213 corresponding to the main board 12, and the loading section 222 of the power transmission unit 22 has a coupling section 223 corresponding to the control panel 14 to achieve secured anchoring. Furthermore, the coupling sections 213 and 223 may be soldered to the main board 12 and the control panel 14. The loading sections 212 and 222 of the power receiving unit 21 and the power transmission unit 22 have respectively a connection hole 214 and 224 to receive fasteners 30 to engage with the fastening hole 26 of the fastening section 25 to establish electric connection between the power receiving unit 21 and the power transmission unit 22 through the conductive connection element 23.

Figure 4:
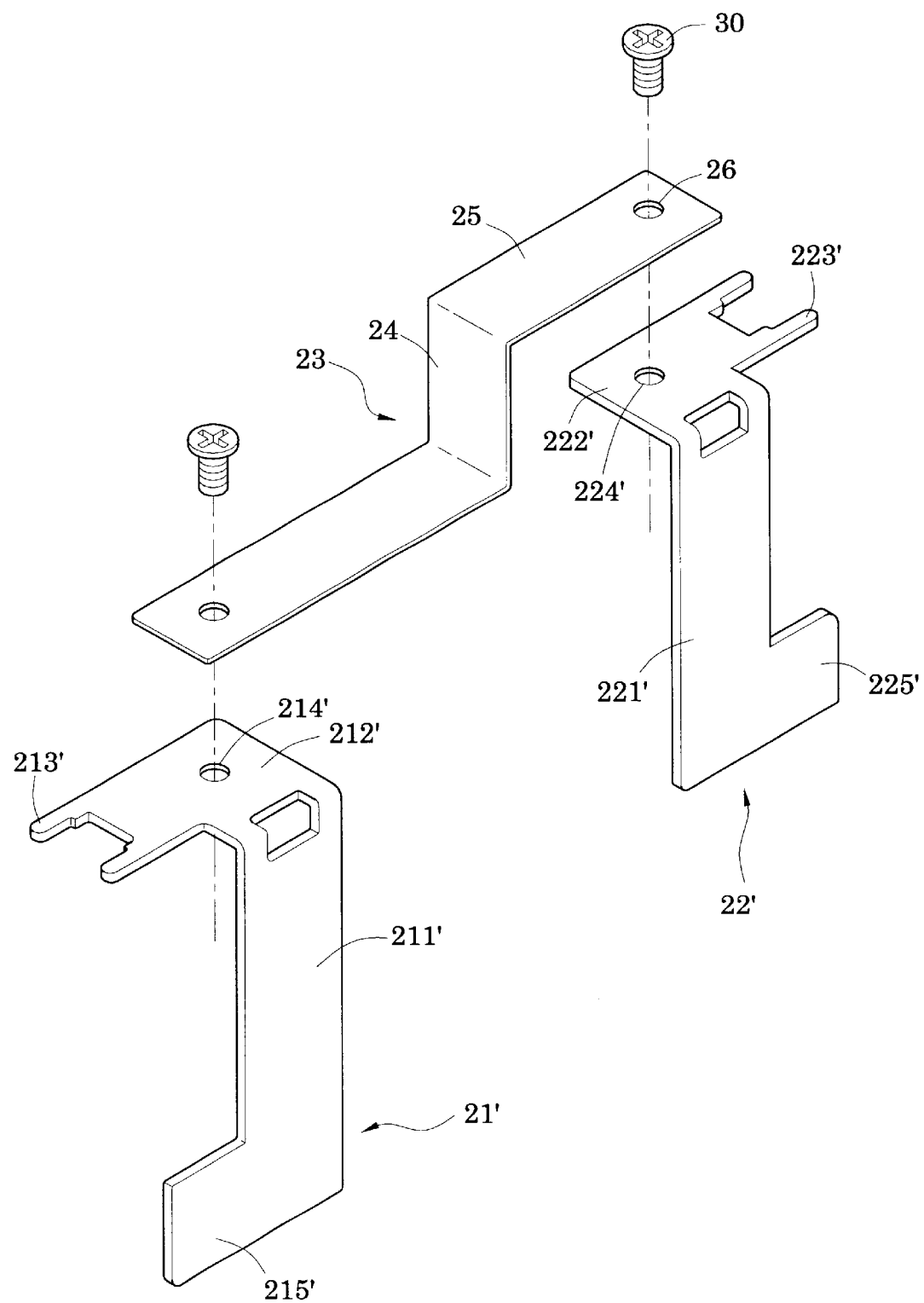
FIG. 4 is an exploded view of another embodiment of the invention.

Refer to FIGS. 3 and 4 for the exploded structure and another embodiment of the invention. As the output location and voltage of the power supply devices 13 (referring to FIG. 2) are different, the loading sections 212 and 222 of the power receiving unit 21 and the power transmission unit 22 may have different extending sections 211 and 221 corresponding to voltage distribution. Referring to FIG. 3, the extending sections 211 and 221 of the power receiving unit 21 and the power transmission unit 22 are connected to a jumper (not shown in the drawing) for linking to the control panel 14. FIG. 4 illustrates another approach of the invention that extends the extending sections 211' and 221' of the power receiving unit 21' and the power transmission unit 22', and the lower ends of the extending sections 211' and 221' have coupling sections 215' and 225' connecting to the control panel 14 without the jumper.

In summary, the invention provides the following features:

1. The invention has a blade conductive connection element 23 to connect the power receiving unit 21 and the power transmission unit 22. The housing space between the main board 12 and the control panel 14 may be simplified to enable the cooling fan sets 15 to effectively disperse heat from the interior of the host casing 10.

2. The power receiving unit 21 and the power transmission unit 22 are connected to the fastening section 25 by engaging the fasteners 30 with the connecting holes 214 and 224 and the fastening hole 26. Connection is more secured between the conductive connection element 23 and the power receiving unit 21 and the power transmission unit 22. It is less likely to be broken under stretching forces.

3. The conductive connection element 23 is bent to form the adjusting section 24 corresponding to the elevation difference of the power receiving unit 21 and the power transmission unit 22. Thus the fastening section 25 of the conductive connection element 23 can bridge the loading sections 212 and 222 of the power receiving unit 21 and the power transmission unit 22 horizontally to facilitate coupling of the fasteners 30.

What is claimed is:

1. A power supply structure for high density servers bridging a system end and a power supple end, comprising:

a power receiving unit located on the system end;

a power transmission unit located on the power supply end; and a conductive connection element connecting the power receiving unit and the power transmission unit through fasteners;

wherein the conductive connection element establishes electric connection with the power receiving unit and the power transmission unit through the fasteners so that power supply provided by the power supply end is transmitted from the power transmission unit to the conductive connection element which in turn transmits the power to the system end through the power receiving unit to facilitate fast assembly and installation of the power supply structure, wherein the conductive connection element has fastening sections corresponding respectively to the power transmission unit and the power receiving unit, the fastening sections being bridged by an adjusting section.

2. The power supply structure for high density servers of claim 1, wherein the system end includes processing units and a main board, the power supply end including power supply devices and a control panel.

3. The power supply structure for high density servers of claim 1, wherein the adjusting section corresponds to the elevation difference of the power transmission unit and the power receiving unit.

4. The power supply structure for high density servers of claim 1, wherein the power transmission unit and the power receiving unit have respectively a loading section, the loading sections having respectively a connection hole corresponding to a fastening hole formed on the fastening section.

5. The power supply structure for high density servers of claim 4, wherein the loading sections have respectively a coupling section corresponding to the main board and the control panel.

6. The power supply structure for high density servers of claim 4, wherein the loading sections of the power transmission unit and the power receiving unit have respectively an extending section corresponding to voltage distribution.

7. The power supply structure for high density servers of claim 6, wherein the extending sections have respectively a connecting section for connecting the main board and the control panel.

* * * * *